(12) United States Patent
Moon

(10) Patent No.: US 11,615,225 B2
(45) Date of Patent: Mar. 28, 2023

(54) LOGIC SIMULATION OF CIRCUIT DESIGNS USING ON-THE-FLY BIT REDUCTION FOR CONSTRAINT SOLVING

(71) Applicant: Synopsys, Inc., Mountain View, CA (US)

(72) Inventor: In-Ho Moon, Hillsboro, OR (US)

(73) Assignee: Synopsys, Inc., Mountain View, CA (US)

( * ) Notice: Subject to any disclaimer, the term of this patent is extended or adjusted under 35 U.S.C. 154(b) by 73 days.

(21) Appl. No.: 17/023,153

(22) Filed: Sep. 16, 2020

(65) Prior Publication Data

US 2021/0089695 A1 Mar. 25, 2021

Related U.S. Application Data

(60) Provisional application No. 62/903,468, filed on Sep. 20, 2019.

(51) Int. Cl.
  *G06F 7/72* (2006.01)
  *G06F 7/44* (2006.01)
  *G06F 30/367* (2020.01)
  *G06F 30/327* (2020.01)
  *G06F 9/451* (2018.01)

(52) U.S. Cl.
  CPC ............ *G06F 30/367* (2020.01); *G06F 7/446* (2013.01); *G06F 7/727* (2013.01); *G06F 9/451* (2018.02); *G06F 30/327* (2020.01)

(58) Field of Classification Search
  CPC ........ G06F 30/367; G06F 7/446; G06F 7/727; G06F 9/451; G06F 30/327; G06F 30/3308; G06F 7/72

USPC ...................................................... 703/15, 14
See application file for complete search history.

(56) References Cited

U.S. PATENT DOCUMENTS

| | | | | |
|---|---|---|---|---|
| 2002/0138812 A1* | 9/2002 | Johannsen | .......... | G06F 30/3323 716/103 |
| 2012/0278675 A1* | 11/2012 | Qiang | ................... | G06F 30/398 714/739 |
| 2015/0040107 A1* | 2/2015 | Iyer | ....................... | G06F 30/327 717/131 |

OTHER PUBLICATIONS

Sebastien Bardin and Philippe Herrmann, "OSMOSE: automatic structural testing of executables", 2011, Software Testing, Verification and Reliability 21.1, pp. 29-54.*

(Continued)

*Primary Examiner* — Juan C Ochoa
(74) *Attorney, Agent, or Firm* — Fenwick & West LLP

(57) ABSTRACT

A system performs logic simulation of a circuit design specified using a hardware description language such as Verilog. The system performs constraint solving based on an expression specified in the specification of the circuit design. The system identifies required bits for each variable in the expression. The number of required bits is less than the number of bits specified in the variable declaration. The system performs bit-level constraint solving by performing a bit operation on the set of required bits and a simplified processing of the remaining bits of the variable. Since the original circuit design is preserved with the original bit-widths for simulation, those required bits are used on the fly internally during constraint solving. Furthermore, dynamic bit reductions on arithmetic operations are performed on the fly. The system improves computational efficiency by restricting bit operations to fewer bits of variables and operators of the expression.

20 Claims, 11 Drawing Sheets

(56) References Cited

OTHER PUBLICATIONS

Zeljić et al., "Approximations for model construction", 2014, International Joint Conference on Automated Reasoning, Springer, Cham, 16 pages.*

Bardin et al., "An alternative to SAT-based approaches for bit-vectors", 2010, International Conference on Tools and Algorithms for the Construction and Analysis of Systems, Springer, Berlin, Heidelberg, pp. 84-98.*

Kitchen, N. et al., "Stimulus Generation for Constrained Random Simulation," 2007 IEEE/ACM International Conference on Computer-Aided Design, Nov. 2007, pp. 258-265.

Puri, R. et al., "A BDD SAT solver for satisfiability testing: An industrial case study," Annals of Mathematics and Artificial Intelligence, 1996, pp. 315-337, vol. 17, No. 2.

Yuan, J. et al., "Modeling Design Constraints and Biasing in Simulation Using BDDs," 1999 IEEE/ACM International Conference on Computer-Aided Design, Nov. 1999, pp. 584-589.

* cited by examiner (a) Computing required bits from value range (b) Modeling reduced bits (c) Extended final results with padding the sign bit

LOGIC SIMULATION OF CIRCUIT DESIGNS USING ON-THE-FLY BIT REDUCTION FOR CONSTRAINT SOLVING

CROSS REFERENCE TO RELATED APPLICATIONS

This application claims a benefit of U.S. Patent Application Ser. No. 62/903,468, filed Sep. 20, 2019, the contents of which are incorporated by reference herein.

TECHNICAL FIELD

This disclosure relates to the field of electronic design automation in general, and more specifically to optimized execution of logic simulation of circuit designs using on-the-fly bit reduction for processing expressions representing portions of the circuit.

BACKGROUND

Electronic design automation deals with circuits with increasing design complexity. One of the operations performed during electronic design automation is logic simulation. Logic simulation is performed using specification of an electronic circuit provided using a hardware description languages (HDL), for example, Verilog. The circuit design specification may include behavioral description, for example, functions and tasks performed using the circuit design, register-transfer level (RTL) description specifying the characteristics of the circuit using operations and the transfer of data between the registers, and gate level specification describing the characteristics of a system using logical links and their timing properties.

The circuit design specification includes a set of constraints for constrained random simulation and the constraints include variables that represents registers as well as operations performed using the data, for example, operations specified using logical expressions based on relational operators, bit-wise operations, logical operators and so on. The circuit design often includes variables that are much larger than the values that may be stored in them. For example, a 16-bit register may be specified for storing values that are never greater than 10. A logic simulator often performs computation intensive processes, for example, bit-level constraint solving that can be exponential in the number of bits being processed. As a result, processing of conventional logic simulators is highly computation intensive and often executed inefficiently.

SUMMARY

Disclosed is a configuration (e.g., system, method, non-transitory computer readable storage medium storing instructions executable by a processor) for optimized execution of logic simulation of a circuit design. The system receives a specification of a circuit design using a hardware description language, for example, Verilog. The system receives a request to perform logic simulation of the circuit design. The specification of the circuit design includes expressions specifying operations based on variables. The operations include shift operation, multiplication operation, division operation, modulo operation, comparison (or equality) operation, or combination of these operations. The specification of the circuit design includes a declaration of the variables of the expressions. The declaration of a variable may use more bits than may be necessary.

The system executes the expressions efficiently by reducing the number of bits that are processed for an expression. The system identifies a set of required bits for all variables used in the expression. The number of required bits is determined based on a limit on the value of the variable. The number of required bits is less than the number of bits specified in the declaration of the variable. The system performs word-level and bit-level constraint solving. Embodiments concern bit-level constraint solving using the constraint expressions. The system performs the operation on the set of required bits. The processing of the remaining bits of the variable is different from the processing of the required bits. This allows the system to simplify the processing of the bits that are not required bits.

The required bits may be determined statically based on a determination of the size of values of the variable. For example, if the value assigned to the variable is obtained from a second variable that occupies fewer bits, the required bits of the variable can be reduced to the size of the second variable.

The system may perform on-the-fly bit reduction when processing the expression. For example, assume the expression includes a shift operator performed on an lhs (left hand side) operand and an rhs (right hand side) operand. The system determines the required bits of the rhs operand as a set of least significant bits. The number of least significant bits is determined based on a logarithm of the number of bits of the left operand. The system determines saturation bits as a set of bits of the right operand that cause saturation of the left operand. The system determines the result of the expression based on the values of the saturation bits and the required bits.

The system processes a expression that includes a multiply operation by determining a number of required bits based on the number of bits of the size of a result of the expression. The system determines the final result by repeating the following steps: (1) computing a partial product and (2) determining a partial sum by adding the partial product to the final result. The partial product and the addition operation are restricted to be performed within the required bits and a sign bit.

According to an embodiment, the system performs expressions with a modulo operator by replacing the expression with the modulo with an expression based on multiplication. The system performs the optimizations described herein for multiplication on the modified expression.

In an embodiment, the system processes an expression that includes multiplication and division by determining a number of required bits based on the number of bits of the result of the expression and increases the number of required bits by a value based on the divisor of the division operator.

The system determines a result of logic simulation based on the processing of the logical expression and sends the results of the logic simulation for display.

The features and advantages described in this summary and the following detailed description are not all-inclusive. Many additional features and advantages will be apparent to one of ordinary skill in the art in view of the drawings, specification, and claims hereof.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

Figure 1:
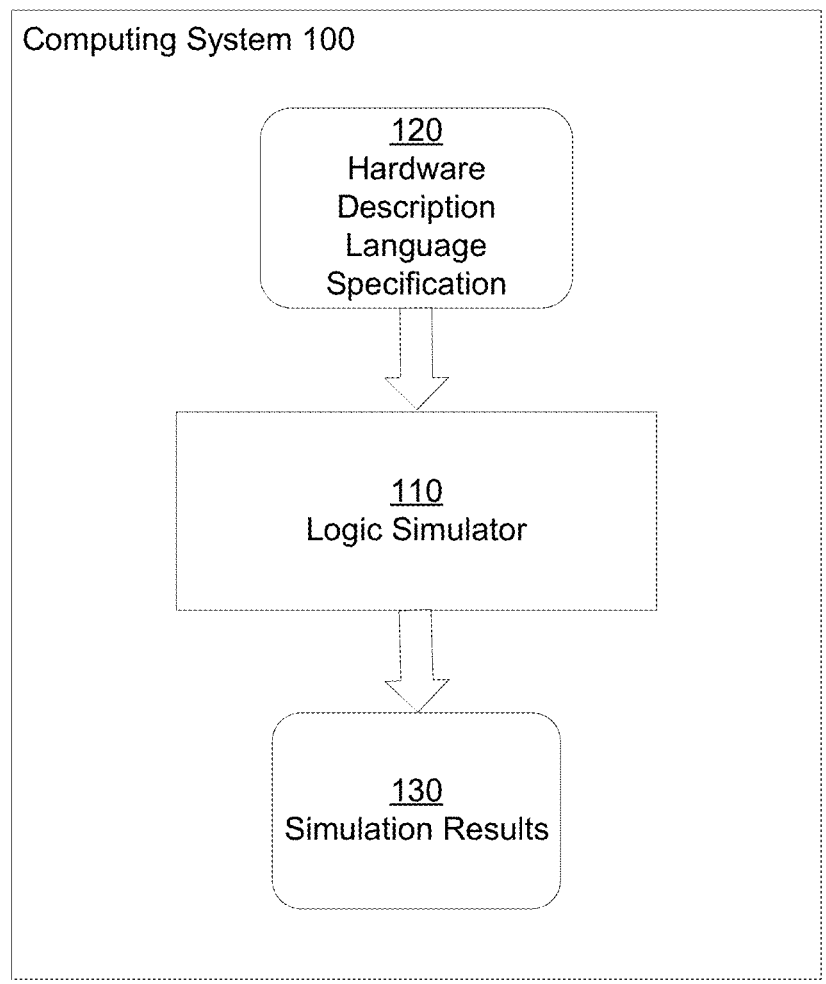
FIG. 1 illustrates the overall environment for optimized execution of logic simulation using on-the-fly bit reduction for logic expression processing according to an embodiment.

The figures use like reference numerals to identify like elements. A letter after a reference numeral, such as "105a," indicates that the text refers specifically to the element having that particular reference numeral. A reference numeral in the text without a following letter, such as "105," refers to any or all of the elements in the figures bearing that reference numeral (e.g. "105" in the text refers to reference numerals "105a" and/or "105n" in the figures).

DETAILED DESCRIPTION

The electronic design automation process includes logic simulation for checking correctness of an integrated circuit. Circuit designers perform logic simulation to verify whether the circuit design meets its specifications and contains any design errors. Logic simulation is performed using a specification of a circuit design specified in a hardware description language (HDL), for example, Verilog or VHDL (Very High Speed Integrated Circuit Hardware Description Language).

During logic simulation, the system applies various inputs to a module and determines the outputs of the module. The outputs are checked to verify that the module operates correctly. According to various embodiments, the system performs logic simulation by generating a netlist from the hardware description language specification of the circuit design. The system propagates the input signals through the netlist to determine the outputs. Logic simulation allows circuit designers to check the values of signals inside your system that might be impossible or very difficult to measure on a physical piece of hardware. If the circuit design operates correctly, the circuit design is processed further and is sent for fabrication of the integrated circuit.

FIG. 1 illustrates the overall environment for optimized execution of logic simulation using on-the-fly bit reduction for logic expression processing according to an embodiment. The logic simulator 110 receives a specification 120 of a circuit design specified using a hardware description language, for example, Verilog. The logic simulator 110 performs logic simulation of the circuit design to generate simulation results 130. The simulation results 130 may be stored or provided for display via a client device to users.

Logic simulation performs several operations that process logic expressions. One of the operations performed during logic simulation is constraint solving. Constraint solving or constraint satisfaction represents the process of finding a solution to a set of constraints that impose conditions that the variables must satisfy. The system identifies a set of variables, a finite and discrete domain for each variable, and a set of constraints. Each constraint is defined over some subset of the original set of variables and limits the combinations of values that the variables in this subset can take. The system finds one assignment to the variables such that the assignment satisfies all the constraints. The system may find all such assignments.

In an embodiment, the system performs constraint solving using via generate-and-test technique. Accordingly, the system generates each possible combination of the variables and then tests it to see if it satisfies all the constraints. The first combination that satisfies all the constraints represents the solution. The number of combinations considered by this technique is the size of the Cartesian product of all the variable domains and is exponential in the size of the input. The system may use techniques to make the process efficient, for example, backtracking. However, the worst case timing for these techniques is still exponential in the size of the input.

A system performing constraint solving may use one or more of two types of solvers: (1) word-level or (2) bit-level solvers (binary decision diagram (BDD) and boolean satisfiability (SAT)). A binary decision diagram represents a function or an expression as a graph in which non-terminal nodes represent variables. A node has two outgoing edges, corresponding to the cases where the variable evaluates to 0 or to 1. For any assignment to the variables, the system determines the function or expression value by tracing a path from the root to a terminal node following the appropriate branch from each node. The system uses the BDD for processing expressions, for example, for constraint solving.

Word-level solvers are more scalable than bit-level solvers. However, there are many small and medium size problems in which bit-level solvers perform better than word-level solvers. Thus, both word-level and bit-level solvers are used together for logic simulation. The performance of bit-level solvers is heavily dependent on both the bit-widths i.e., precisions of the variables in the constraints and the bit-widths of arithmetic operators such as multiply, shift, modulo.

Embodiments improve the performance of constraint solver by performing bit-level constraint solving with fewer bits for variables and internal operations of the arithmetic operators. The logic simulator 110 according to various embodiments, performs internal bit reductions on the fly. The on-the-fly bit reduction technique disclosed results in significant performance improvements in bit-level constraint solving.

For example, complexity of arithmetic operations is exponential in terms of the bit-widths. By reducing bits on-the-fly, embodiments make bit-level constraint solving exponentially faster with reduced bit-widths of the arithmetic operations. The techniques disclosed keep the original bit-widths of the variables and arithmetic operators since the solutions are provided in terms of the values on the original bit-widths of the primary input variables. As a result, existing techniques that explicitly reduce the input circuit are not applicable. In contrast, embodiments keep the original input circuit with the original bit widths, the internal arithmetic operations are done by internal bit reductions on the fly. The logic simulator 110 according to various embodiment, obtains the final values on the original bits from the internal values on the reduced bits.

Embodiments process fewer bits of variables and as a result generate the BDD using fewer bits. The reduction in bits improves the representation of the BDD exponentially since the number of combinations of the binary values of a set of bits is exponential in the number of bits. The reduction in size of the BDD results in efficient execution of the constraint solving performed using the BDD.

Figure 2:
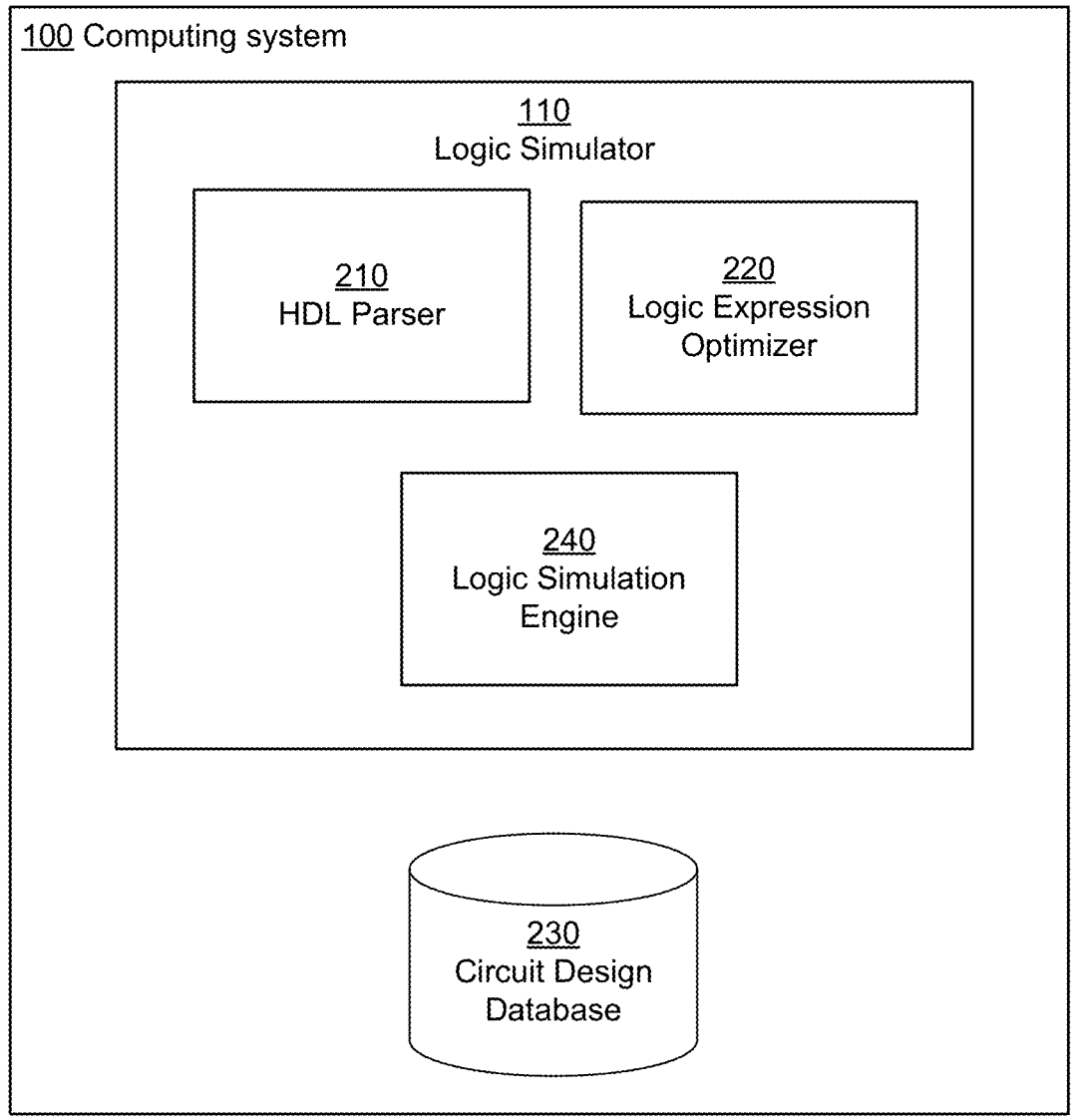
FIG. 2 shows a block diagram of a system architecture of a logic simulator according to an embodiment.

Although the techniques are described herein for on-the-fly bit reduction of constraint solving are applied to logic simulation, the techniques disclosed herein can be applied to other applications based on constraint solving. For example, the technique disclosed herein for efficient constraint solving may be used in artificial intelligence, machine vision, belief maintenance, scheduling, temporal reasoning, graph problems, floor plan design, the planning of genetic experiments System Architecture FIG. 2 shows a block diagram of a system architecture of a computing system configured to perform on-the-fly bit reductions according to an embodiment. The computing system 100 includes a logic simulator 110 and a circuit design database 230. The logic simulator 110 includes an HDL parser 210, a logic expression optimizer 220, and a logic simulation engine 240. Other embodiments may include more or fewer components than those indicated herein. Functionality indicated herein as being performed by a particular module may be performed by other modules than those indicated herein. The computing system 100 may also be referred to herein as a system.

The circuit design database 230 stores the circuit designs that are processed by the logic simulator 110. The circuit designs are specified using a hardware description language such as Verilog. The HDL parser 210 receives circuit designs specified using the hardware description language and parses it to extract information describing the circuit design. The logic simulation engine 240 processes the circuit design to perform logic simulation.

In an embodiment, the logic simulator 110 generates a netlist representation of the circuit design from the specification of the circuit design. The logic simulator 110 generates bit representations of various combinations of input signals for the circuit design and propagates each input signal through the circuit design to determine results of the logic simulation. The logic simulator 110 performs the processes according to various embodiments disclosed herein that optimize execution of various expressions in the specification of the circuit design during this process.

The logic simulation engine 240 invokes the logic expression optimizer 220 to optimize executions of various statements of the circuit design that use logic expressions. The logic expression optimizer 220 implements the various processes disclosed herein that optimize execution of logic expressions, for example, processes that perform on-the-fly bit reductions.

In some embodiments, the logic simulator 110 uses binary decision diagrams (BDDs) for processing logic expressions. The logic simulator 110 may build a BDD for a function, for example, boolean function by building a decision tree representing a function, applying reduction rules by merging duplicate nodes and eliminating redundant nodes to build an acyclic graph representing the function. The logic simulator 110 may use BDDs for efficient representation of functions.

The logic simulator 110 may provide different input vectors to the representation of a circuit design to simulate the circuit.

In some embodiments, the logic simulator 110 performs boolean satisfiability by performing exploration of a search space to determine whether a property always holds. Given a boolean function, the logic simulator 110 determines using boolean satisfiability, whether the variables of the boolean formula can be consistently replaced by the values true or false in such a way that the formula evaluates to true. If this is the case, the logic simulator 110 determines that the formula is satisfiable. On the other hand, if logic simulator 110 determines that no such assignment exists, the logic simulator 110 determines that the function expressed by the formula is false for all possible variable assignments and the formula is unsatisfiable. These techniques take exponential time in terms of number of bits processed for performing boolean satisfiability, thereby making it a highly computation intensive process.

The circuit design specification often includes variables that are represented using more bits than necessary since design engineers may not spend enough time to determine the exact number of bits necessary for each variable. Embodiments reduce the number of bits that are processed, thereby resulting in an exponential improvement in performance compared to techniques that process all the bits that were specified in the description of the circuit design. The techniques disclosed herein can be applied to other processes that evaluate logic expressions for various input values.

Overall Process

FIGS. 3-7 describe various processes executed by the logic simulator 110 according to various embodiments. The steps shown in the flowcharts illustrated in various figures may be performed in an order different from that indicated in the flowcharts. For example, certain steps may be performed in parallel with other steps. Furthermore, various steps shown in the flowchart may be performed using a parallel or distributed system.

Figure 3:
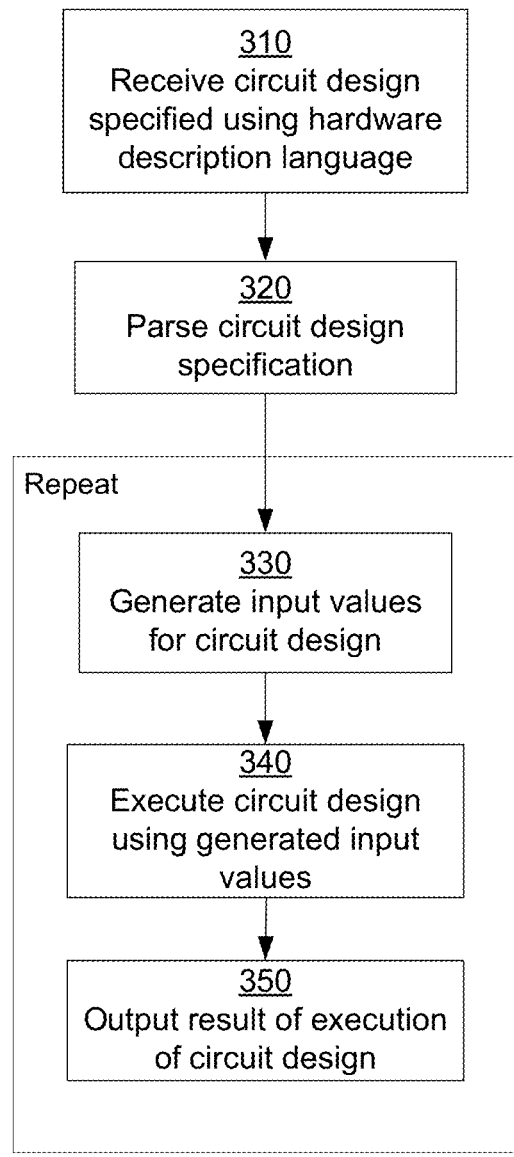
FIG. 3 depicts a flowchart of the process of logic simulation of a circuit design according to an embodiment.

FIG. 3 depicts a flowchart of the process of logic simulation of a circuit design according to an embodiment. The system 100 receives 310 a circuit design specified using an HDL (hardware definition language). The system 100 parses 320 the circuit design to extract information represented in the circuit design, for example, by obtaining a netlist representation of the circuit design. The term circuit design may refer to the entire circuit design or to portions of the circuit design, for example, components or circuit blocks of the circuit design.

The system 100 repeats the steps 330, 340, and 350 for the circuit design. The system 100 generates 330 various input values for the circuit design. The system 100 provides the generated input values as input to the circuit design and executes 340 the circuit design. The system 100 propagates the input values through the netlist of the circuit design.

The system 100 performs logic simulation of the circuit design by processing the various logic expressions representing portions of the circuit design. The system 100 outputs the result of execution of the circuit design, for example, by storing the results in a storage device or by providing the results for display via a peripheral device such as a display screen of a client device. The system 100 may compute the results for several input values before outputting the results.

The system 100 performs at least two on-the-fly reduction techniques for efficient processing of expressions: (1) static bit reduction that reduces the precisions of input variables in the expressions, and (2) dynamic bit reduction that reduces the bit-widths of intermediate results during arithmetic operations.

Figure 4:
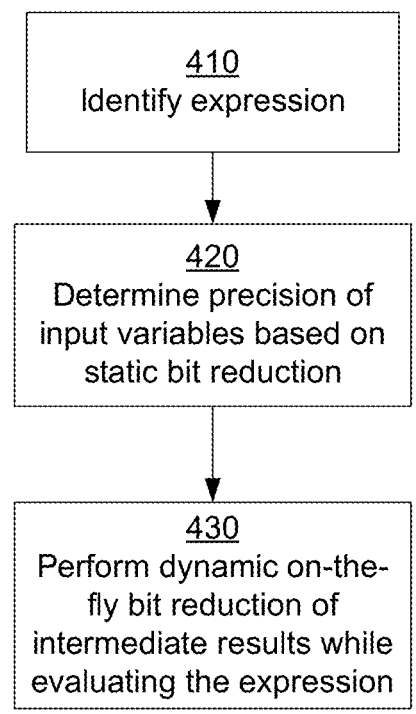
FIG. 4 depicts a flowchart of the process of evaluation of logic expressions according to an embodiment.

FIG. 4 depicts a flowchart of the process of evaluation of logic expressions according to an embodiment. The system 100 identifies 410 an expression from the circuit design that may represent a logic or arithmetic function. The expression is represented using one or more variables that are declared in the HDL specification of the circuit design.

The system 100 performs two types of optimizations for processing the expression. The system 100 determines 420 the precision of the input variables based on static bit reductions. The system 100 processes the expression according to the determined precision so that fewer bits than the number of bits used in the declaration of the variables are processed. The system 100 performs dynamic on-the-fly bit reductions of intermediate results that are obtained while evaluating the expression.

In some embodiments, the system 100 determines initial value ranges of all random variables used in the circuit design. The system performs static bit reduction to determine the number of bits that are actually required in constraint solving for each random variable by using its value range. For example, if a 16-bit variable is determined to have a range [0, 15], the range can be represented by only 4 bits since the maximum value represented is 15 that takes 4 bits to represent. The system may set the higher 12 bits to constant 0 (or, constant 1 by sign extension for signed variable).

The process of this static bit reduction does not handle the case when number of bits used increases for intermediate results during any arithmetic operation. For example, a 16-by-16 multiplier may have output bit width also 16 bits. The 16-by-16 multiplier generates 32-bit result even though only the 16 bits of the result are needed to be considered for the next operation since the output bit is only 16 bits. According to some embodiments, the system performs dynamic bit reduction to reduce the bit widths of intermediate results during arithmetic operations on the fly by analyzing the expression and by looking ahead, the bits of operands that are relevant and the bits of the final result that are actually used.

These on-the-fly bit reduction techniques may improve the efficiency of building BDDs by an exponential factor in terms of number of bits processed. Accordingly, embodiments improve efficiency of execution of arithmetic operations by an exponential factor in bit-level constraint solvers by applying bit reductions on the fly to arithmetic operations such as shift, multiply, modulo, and multiply and division. The system obtains performance improvement by using BDD as a bit-level constraint solver as well as other bit-level solvers, for example, SAT.

Static Bit Reduction

Figure 5A:
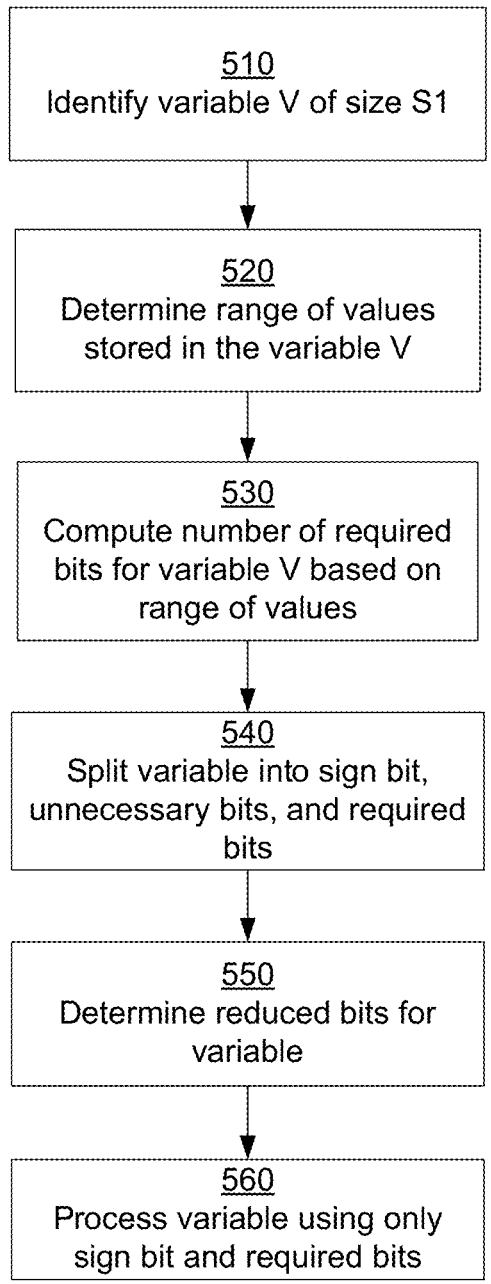
FIG. 5A depicts a flowchart of the process for static bit reduction according to an embodiment.

FIG. 5A depicts a flowchart of the process for static bit reduction according to an embodiment. The steps of FIG. 5A are described in connection with FIG. 5B that illustrates through examples, the process for static bit reduction according to an embodiment.

The system identifies 510 a variable of size S1 bits. The system determines 520 range of values of the values stored in the variable V. The system determines the value range of random variables. The value ranges are obtained from word-level solver by performing implications forward and backward until all value ranges get to a fixed point (i.e., no further changes), or until a resource limit is hit (for example, a max number of implications). The results are over-approximate.

The system computes 530 the number of required bits for variable V based on the range of values. The system may determine the number of bits required to represent a value range by taking logarithm (log) values of the low/high values of range. For example, if the range of values of a variable is [low, high], number of bits required to represent a value range, denoted as a value required_bits=ceil(log$_2$(MAX(abs(low), abs(high))))+1, where ceil is the ceiling function and abs is the absolute value. Accordingly, the system determines the number of required bits to represent a range that has lower bound low and higher bound high by determining the logarithm of the maximum of the absolute value of low and absolute value of high.

Figure 5B:
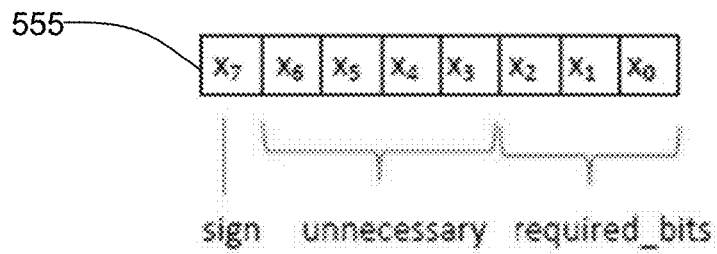
FIG. 5B illustrates through examples, the process for static bit reduction according to an embodiment.
Figure 5B:
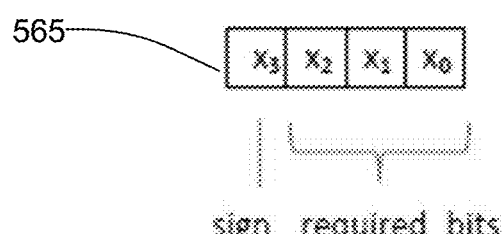
Figure 5B:
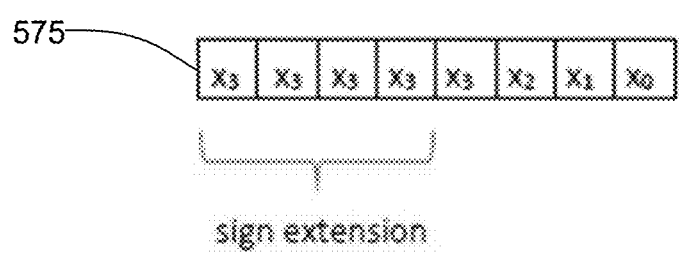

The system 100 splits the variable into a sign bit, unnecessary bits, and required bits. FIG. 5B shows the representation 555 that has bits $x_2$, $x_1$, $x_0$ as required bits, bits $x_6$, $x_5$, $x_4$, $x_3$ as unnecessary bits and bit $x_7$ as the sign bit. The system determines 550 reduced bits for the variable. For example, the representation 565 in FIG. 5B shows the reduced bits $x_3$, $x_2$, $x_1$, $x_0$, where bit $x_3$ of representation 565 corresponds to bit $x_7$ of representation 555 and bits $x_2$, $x_1$, $x_0$, of representation 565 correspond to bits $x_2$, $x_1$, $x_0$ of representation 555.

The system 100 processes the variable using only the required bits. By eliminating the unnecessary bits and moving the sign bit from $x_7$ to $x_3$, the system gets reduced bits for the variable that are used in actual constraint solving. From constraint solving, once the system assigns the value on the reduced bits, the system extends the sign bit up to the most significant bit (msb) of the original bits of the variable as shown in representation 575 of FIG. 5B. Accordingly, the bits $x_7$, $x_6$, $x_5$, $x_4$, of representation 555 are all set to the value of sign bit $x_3$ from representation 565 to obtain the representation 575.

In some embodiments, the system 100 performs bit reductions on unconstrained bits as follows. For example, assume that the random variable is declared as "rand bit[15:0] x" and a constraint is specified "constraint cons {x[3:0]<=10;}" indicating that the least significant four bits are constrained to carry a maximum value of 10. Accordingly, the system 100 needs to solve only x[3:0] and x[15:4] are unconstrained bits. The system 100 solves the unconstrained bits independent of the constrained bits. Since these bits are unconstrained, solving these bits is less time consuming than solving the constrained bits. This results in improved computational efficiency in solving. The system 100 may identify the unconstrained bits of variable by traversing all constraints structurally in the circuit.

Dynamic Bit Reduction

Figure 6A:
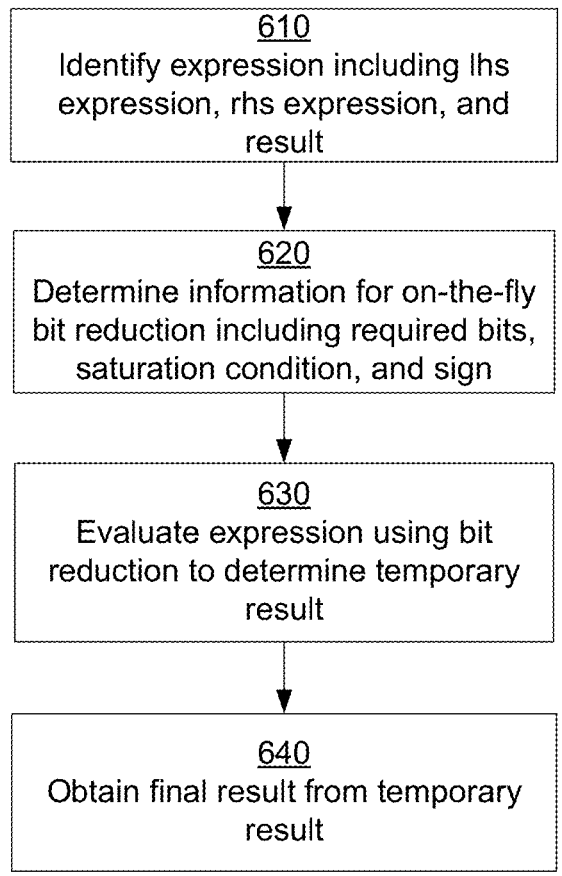
FIG. 6A depicts a flowchart of the process for dynamic bit reduction for shift operation according to an embodiment.
Figure 6B:
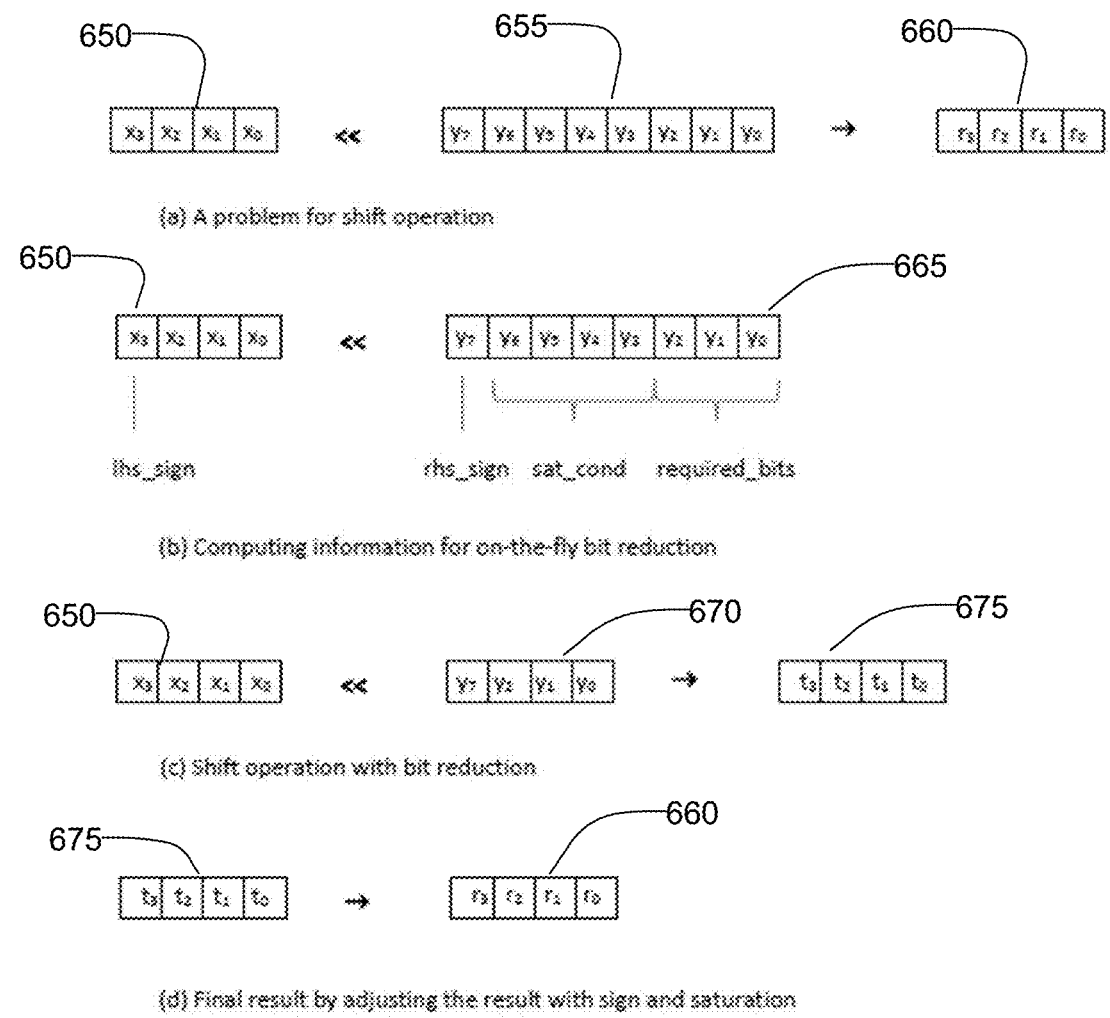
FIG. 6B illustrates through examples, the process for dynamic bit reduction for shift operation according to an embodiment.

FIG. 6A depicts a flowchart of the process for dynamic bit reduction for shift operation according to an embodiment. The steps of FIG. 6A are described in connection with FIG. 6B that illustrates through examples, the process for dynamic bit reduction for shift operation according to an embodiment. The shift operation may be a left shift operation or a right shift operation. For example, a shift expression can be represented as "lhs>>rhs" (right shift) or "lhs<<rhs" (left shift). An operand of a shift operation can be an expression or a variable. The system identifies an expression in the specification of the circuit design. The expression includes an lhs (left hand side) operand 650 and an rhs (right hand side) operand 655. As shown in FIG. 6B, lhs={$x_3$, $x_2$, $x_1$, $x_0$} and rhs={$y_7$, $y_6$, $y_5$, $y_4$, $y_3$, $y_2$, $y_1$, $y_0$}, the result of the shift operation={$r_3$, $r_2$, $r_1$, $r_0$}. A shift operation can be shift left, shift right, arithmetic shift left, or arithmetic shift right. In case of arithmetic shift right, if the system shifts the lhs value more than the bit width of (lhs−1), the result becomes 0 (i.e., 000 . . . 000) or −1 (i.e., 111 . . . 111), depending on the MSB (most significant bit) of the lhs. This is referred to as saturation.

Following is a snippet of a specification using a hardware description language that specifies a shift operation. The specification includes two variables x and y.

rand bit[3:0] x;
 rand bit signed [55:0] y;
 constraint cons {(((x>>((2*(y−2))+(y−2))) & 1'h1)==1'h1);}

For example, the above snippet specifies two variables x and y, the variable x having 4 bits and variable y having 56 bits. The expression (((x>>((2*(y−2))+(y−2))) & 1'h1)==1'h1) includes a right shift expression with lhs operand x and rhs operand ((2*(y−2))+(y−2)).

The system determines 620 information for performing on-the-fly bit reduction for processing the expression including: (1) required_bits: number of bits are necessary for evaluating the expression, (2) sat_cond: saturation condition (3) sign: the sign value on the final result.

In an embodiment, the system computes the required bits on rhs based on the bit width of rhs as required_bits=log$_2$((bit width of lhs)+1. Accordingly, the system determines the number of required bits as the logarithm to the base 2 of the bit width of lhs. The system adds 1 to the value of log$_2$((bit width of lhs) to determine the ceiling of log$_2$ operation.

The system determines whether saturation occurs or not as follows. Assume that the expression has an rhs operand "y" of m bits for a shift operation, and the required bits is k from lhs of the shift operation. The bits {y[m−1], y[k−1], y[k−2], . . . , y[0]} are required for normal shift operation. Although bits {y[m−2], . . . , y[k]} are not required for normal operation, if any one of {y[m−2], . . . , y[k]} is 1, the operation results in saturation. Thus, the condition function for saturation (sat_cond) is sat_cond=y[m−2] || . . . || y[k], i.e., the bit OR operation of bits y[m−2], . . . , y[k], determining whether any of the bits y[m−2], . . . , y[k], is 1. The values of sat_cond=y[m−1] || . . . y[k], depending on whether the sign bit needs to be considered or not. For example, when both operands have only positive (non-negative) values, there is no need to consider the sign bit.

When a saturation happens, we need to update the output function expression of each bit. Also, a saturation can happen on arithmetic shift left operation if the rhs has a negative value, that changes it to shift right. The sign value can be computed as below, when a saturation happens.

```
lhs_sign = msb of lhs;
rhs_sign = msb of rhs;
sign = 0;
if (arithmetic_shift) {
    if (lhs_sign != 0) {
        if (shift_left) tmp_sign = 0;
        else tmp_sign = 1;
    }
    sign = lhs_sign && tmp_sign;
}
```

Accordingly, if arithmetic shift is performed, and lhs sign is not 0, the system determines tmp_sign as 0 if left shift operation is specified or else tmp_sign is 1 if right shift operation is performed. The value of sign of the final result is determines as a bit AND of lhs_sign and tmp_sign.

The system evaluates the expression using the on-the-fly bit reduction to determine temporary result. The system uses reduced operands. For example, as shown in FIG. 6B, the shift operation is performed on reduced variable y (identified as 670 in FIG. 6B) that has bits {y$_7$, y$_2$, y$_1$, y$_0$} instead of the declared variable y (identified as 665 in FIG. 6B) that has more number of bits {y$_7$, y$_6$, y$_5$, y$_4$, y$_3$, y$_2$, y$_1$, y$_0$}. The reduced variable y is obtained by adding the sign bit y$_7$ to the required bits {y$_2$, y$_1$, y$_0$}. The result determined using the reduced bits is represented as variable t (identified as 675 in FIG. 6B).

The system obtains the final result from the temporary result. For example, result r (identified as 660 in FIG. 6B) is obtained from variable t (identified as 675 in FIG. 6B). The system obtains the final result by adjusting the temporary result {t$_3$, t$_2$, t$_1$, t$_0$} by applying the saturation condition and the sign. Since sat_cond indicates whether a saturation happens or not, and sign indicates which value each bit should be between 0 and 1, the system updates the expression of each bit of {t$_3$, t$_2$, t$_1$, t$_0$} as below.

```
for (i = 0; i < the bit width of r; i++)
    { ri = ITE(sat_cond, sign, ti); }
```

In this snippet of HDL, the function ITE represents if-then-else construct implemented as a multiplexer. The final result {r$_3$, r$_2$, r$_1$, r$_0$} is the same as a result obtained without on-the-fly bit reduction since the computations are equivalent.

Bit Reductions on Multiply/Modulo/Division Operations

In general, when the system processes expressions with multiply operation with two operands of m bits and n bits, the output bit width of the result becomes (m+n) bits. However, if the system is performing constraint solving, not all the bits are used in solving constraint problems. Following is an example of bit reduction on multiply operators. An array arr is declared as having size of 18 elements.

rand bit [7:0] arr[ ];
 constraint cons1 { arr.product inside {[10:100]};}

The operator "inside" specifies one or more ranges of values for a variable. For example, 'x inside {[0:10], [20:30]}' is equivalent to specifying '(0<=x && x<=10) ||20<=x && x<=30)', i.e., x is specified to be one of the values in the ranges [0:10] and [20:30]. In the above specification, the constraint "arr.product inside {[10:100]}" specified that the result of arr.product has a value in the range [10:100], i.e., the arr.product is specified to be >=10 and <=100. When the array size is assigned to 18, the constraint becomes as follows.

{ ((8'((((((((((((((((arr[0] * arr[1]) * arr[2]) * arr[3]) * arr[4]) * arr[5]) * arr[6]) * arr[7]) * arr[8]) * arr[9]) * arr[10]) * arr[11]) * arr[12]) * arr[13]) * arr[14]) * arr[15]) * arr[16]) * arr[17]))) inside {[10:100]});}

Accordingly, the system multiples the 18 elements of the array arr together. The multiply operations generate the output of 136 bits (i.e., 8*17=136 bits) since the resulting bits get increased by 8 bits at every multiply operation. However, only the 8 bits out of 136 bits are actually used in the computation. The remaining 128 bits are computed redundantly since those bits are never used.

The system determines that the output precision of the whole multiply operations is 8. Accordingly, the system can treat all higher bits bigger than the 8th bit as don't cares, i.e., the value could be either 0 or 1 without affecting the final result. Since the system is concerned in this operation with only the lower 8 bits in the final output, the system does not even build BDDs in bits [135:8] which are don't cares. Accordingly, the system builds a smaller BDD than a system that builds BDDs for all the bits as declared.

The system performs the multiply operation by composing a series of following operations: (1) computing a partial product and (2) adding the partial product to the final result. The system determines the minimal required bits and restricts those two operations (partial product and addition) to be performed only within the required bits, and the sign bit.

Figure 7:
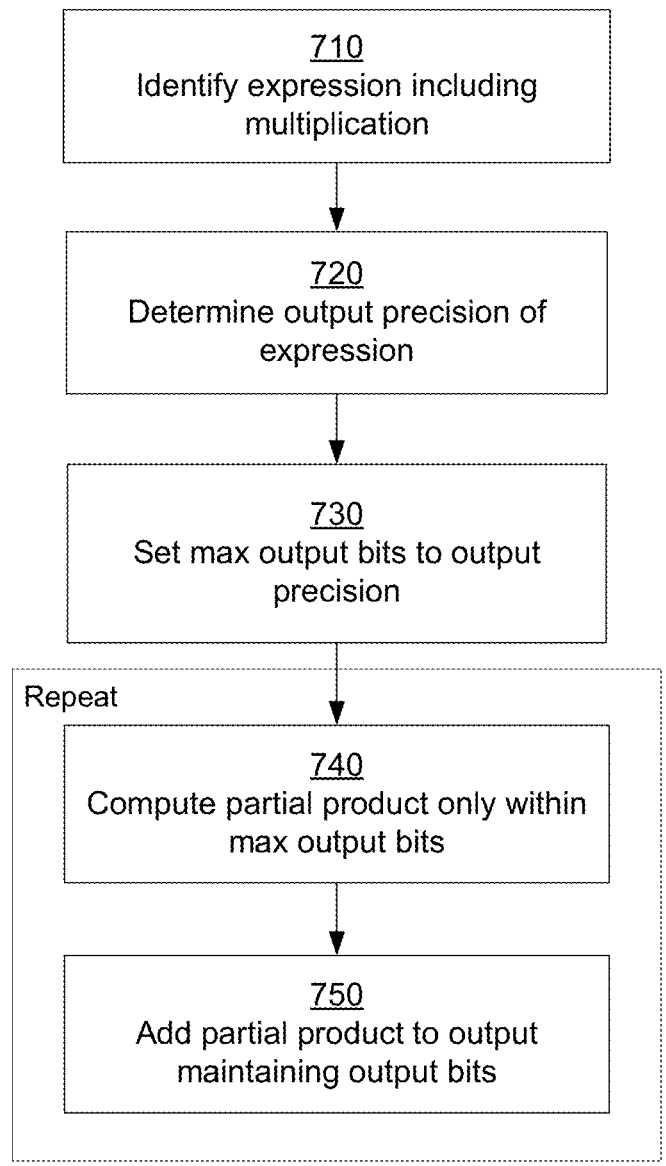
FIG. 7 depicts a flowchart of the process for dynamic bit reduction for multiplication operation according to an embodiment.

FIG. 7 depicts a flowchart of the process for dynamic bit reduction for multiplication operation according to an embodiment. The system identifies 710 an expression in the HDL specification of the circuit design that includes a multiplication operation. The system determines 720 a measure of the output precision of the expression. The system sets 730 the maximum number of output bits to the output precision. The system repeats the following steps 740 and 750. The system computes 740 the partial product only within the maximum number of output bits. The system adds 750 the partial product to the output, maintaining the output bits.

In general in a constraint of the form lhs_expr==rhs_expr, the multiply operation can exist in either lhs_expr or rhs_expr. The system may determine the required bits for the multiply operation as follows. The system determines the required bits from the lhs_expr and the required bits from the rhs_expr. If the system determines that the number of required bits from rhs_expr is greater than zero, the system sets the required bits for rhs to all multiply operators in the lhs_expr. Similarly, if the system determines that the number of required bits from lhs_expr is greater than zero, the system sets the required bits for lhs to all multiply operators in the rhs_expr.

```
lhs_required = compute required bits from lhs_expr;
rhs_required = compute required bits from rhs_expr;
if (rhs_required > 0) {
    set rhs_required to all multiply operators in lhs_expr;
}
if (lhs required > 0) {
    set lhs_required to all multiply operators in rhs_expr;
}
```

The system determines each required bit based on the outer-most cast precision or the bit width of a single variable.

The system performs a modulo (%) operation using multiplication and addition. For example, the following is a constraint using a modulo operation. The variable x is of 4 bits and y is of 16 bits. The constraint includes an expression that performs x % y.

class cls;
rand bit [3:0] x;
rand bit [15:0] y;
constraint cons1 {(x % y)==1'h1;}
endclass The system translates the constraint with modulo operation to following constraint that uses multiply and add.

class cls;
rand bit [3:0] x;
rand bit [15:0] y;
rand bit [15:0] M_2, M_3;
constraint cons1 {(x==((M_2 * y)+M_3));}
endclass The system restricts the resulting multiply operations based on the precision of the result of the multiplication, i.e., the lhs. In this case, the system determines that since the lhs is only 4 bits, the system restricts the multiply operation of (M_2 * y) to only 4 bits in the result, instead of 32 bits (16 * 16 bits).

If the system processes an expression that includes both multiply and division operators together, the system modifies the required bits for multiply operator based on the division operator. In an embodiment, the system determines a number of required bits for the expression based on the number of bits of the result of the expression and increases the number of required bits by a value based on the divisor of the division operator.

For example, assume that the division operator has an lhs expression that represents the dividend and an rhs expression that represents the divisor. When the system processes the expression with a division operator, the system performs bit reduction on the lhs expressions of the division operator. The system increases the required bits by the bit width of the rhs expression of the division operator.

constraint cls;
rand bit [3:0] f; rand bit [7:0] a, b; rand bit [3:0] c, d;
constraint cons1 {(f==((a * b)/(c * d)));}
endclass;

In this example, the system applies bit reduction to (a * b) that is the lhs of the division, not to (c * d) which is the rhs of the division. Also, the system sets the number required bits initially to the bit width of variable f that can be used to determine the size of the result of evaluation of the expression ((a * b)/(c * d)). Since the expression ((a * b)/(c * d)) is compared to variable f, the system infers that the result of evaluation of the expression does not need to compare more bits than the number of bits of variable f. The system increases the number of required bits by the bit width of (c * d). Thus, the system determines the required bits on (a * b) as required_bits=4+(4+4)=12.

Electronic Design Automation Process

Figure 8:
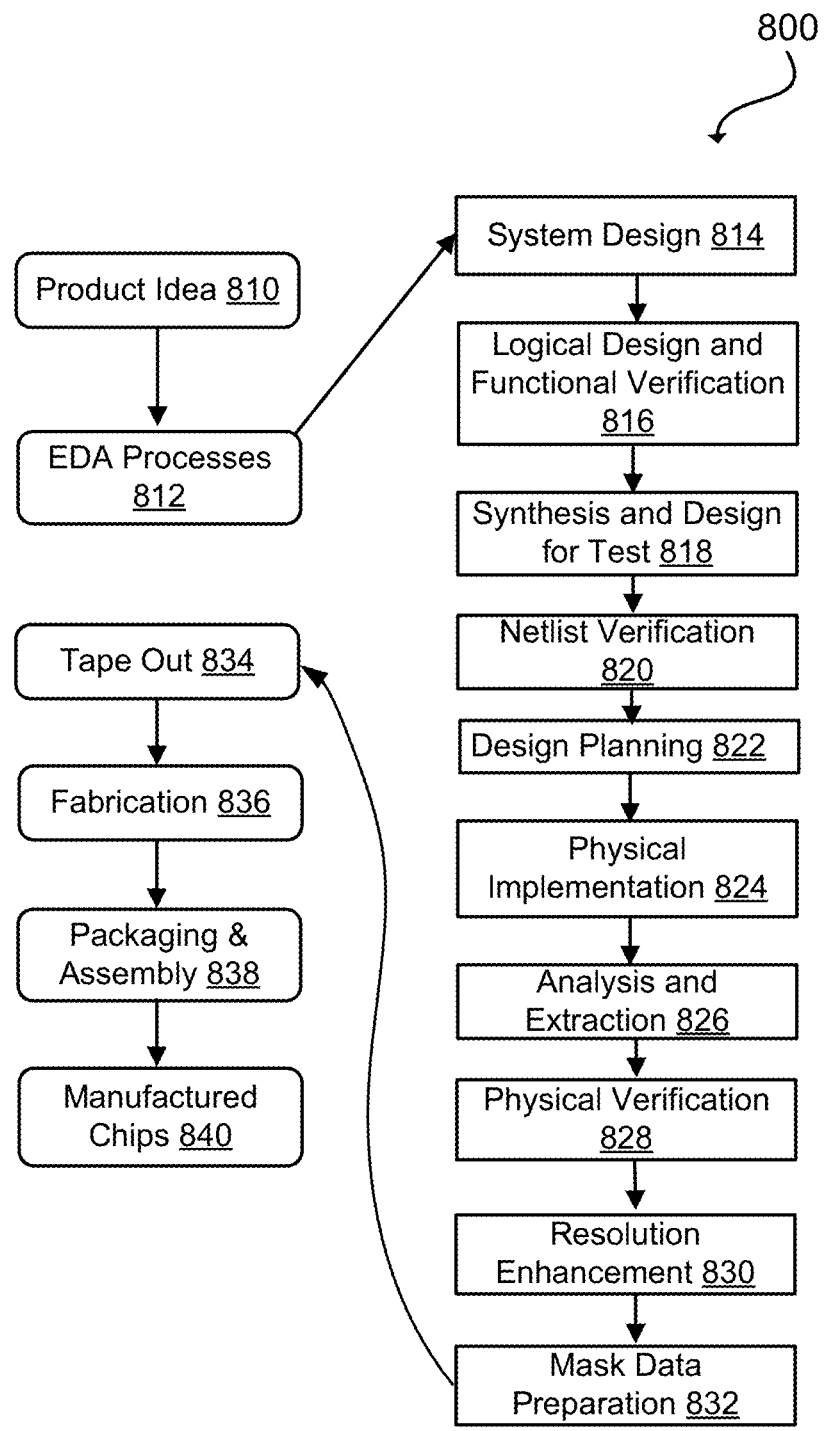
FIG. 8 depicts a flowchart of various processes used during the design and manufacture of an integrated circuit in accordance with some embodiments.

FIG. 8 illustrates an example set of processes 800 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 810 with information supplied by a designer, information which is transformed to create an article of manufacture that uses a set of EDA processes 812. When the design is finalized, the design is taped-out 834, which is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly processes 838 are performed to produce the finished integrated circuit 840.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 8. The processes described by be enabled by EDA products (or tools).

During system design 814, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 816, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 818, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 820, the netlist is checked for compliance with timing constraints and for correspondence with the HDL code. During design planning 822, an overall floor plan for the integrated circuit is constructed and analyzed for timing and top-level routing.

During layout or physical implementation 824, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 826, the circuit function is verified at the layout level, which permits refinement of the layout design. During physical verification 828, the layout design is checked to ensure that manufacturing constraints are correct, such as DRC constraints, electrical constraints, lithographic constraints, and that circuitry function matches the HDL design specification. During resolution enhancement 830, the geometry of the layout is transformed to improve how the circuit design is manufactured.

During tape-out, data is created to be used (after lithographic enhancements are applied if appropriate) for production of lithography masks. During mask data preparation 832, the 'tape-out' data is used to produce lithography masks that are used to produce finished integrated circuits.

A storage subsystem of a computer system (such as computer system 900 of FIG. 9, or host system 807 of FIG. 8) may be used to store the programs and data structures that are used by some or all of the EDA products described herein, and products used for development of cells for the library and for physical and logical design that use the library.

Embodiments can be used for processing the circuit designs during various stages of the electronic design automation process that store the circuit layout, for example, layout or physical implementation 824, analysis and extraction 826, mask data preparation 832, and so on.

Computer Architecture

Figure 9:
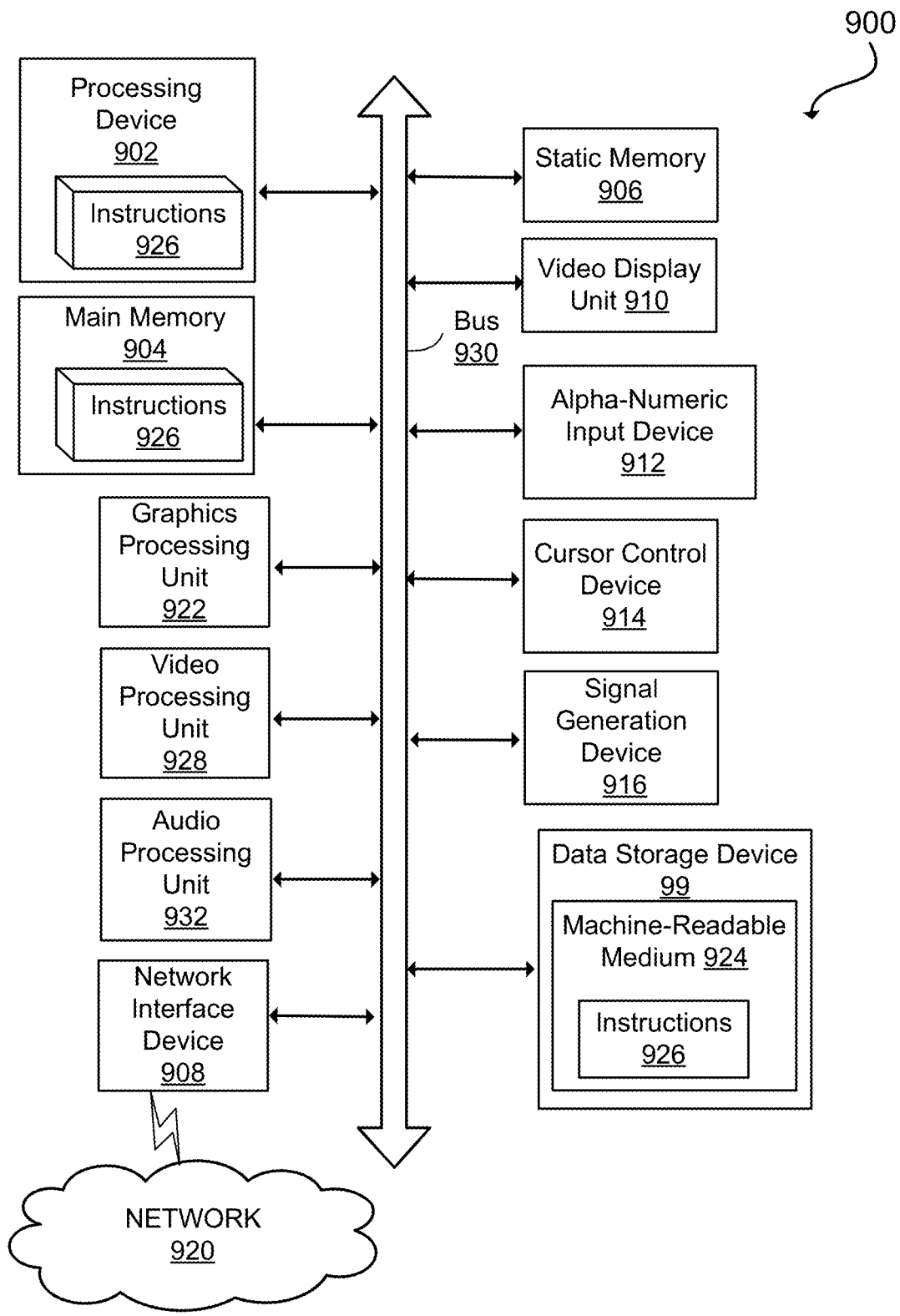
FIG. 9 depicts an abstract diagram of an example computer system in which embodiments may operate.

FIG. 9 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920.

The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method for execution of expressions in logic simulation of a circuit design, the method comprising:
   receiving a specification of the circuit design, the specification using a hardware description language;
   receiving a request to perform logic simulation of the circuit design;
   identifying an expression in the specification of the circuit design, the expression specifying an operation based on a variable, wherein the specification of the circuit design includes a declaration of the variable, wherein evaluation of the operation comprises determining one or more intermediate results;
   identifying a set of required bits for the variable used in the expression, wherein a number of required bits in the set of required bits is less than a number of bits specified in the declaration of the variable;
   performing, by a processor, bit-level constraint solving using the expression by reducing the number of bits of each of the one or more intermediate results to the set of required bits;
   determining a result of logic simulation based on the bit-level constraint solving; and
   sending the result of logic simulation for display.

2. The method of claim 1, further comprising:
generating a netlist representation of the circuit design from the specification of the circuit design;
generating a bit representation of an input signal for the circuit design; and
propagating the input signal through the circuit design to determine results of the logic simulation.

3. The method of claim 1, wherein the specification of the circuit design includes a register transfer level (RTL) description or a gate-level description.

4. The method of claim 1, wherein performing bit-level constraint solving comprises generating a binary decision diagram (BDD) based on the number of required bits that is smaller than a BDD based on the variable as declared.

5. The method of claim 1, wherein the number of required bits is determined based on a range of values stored in the variable.

6. The method of claim 1, wherein the number of required bits is determined as a logarithm of the maximum of:
   (a) absolute value of the largest possible value of the variable, or
   (b) absolute value of the smallest possible value of the variable.

7. The method of claim 1, wherein the expression includes a shift operation comprising a left operand shifted by a value of a right operand, the method comprising:
determining the required bits of the right operand as a set of least significant bits, wherein the size of the set of least significant bits is determined based on a logarithm of the number of bits of the left operand.

8. The method of claim 7, the method further comprising:
determining saturation bits as a set of bits of the right operand that cause saturation of the left operand; and
determining the result of logic simulation based on the values of the saturation bits.

9. The method of claim 1, wherein the expression includes a multiply operation, the method comprising, determining the number of required bits based on the number of bits of the size of a result of logic simulation.

10. The method of claim 9, further comprising, determining a final result of logic simulation by repeating a plurality of times:
   1) computing a partial product and
   2) determining a partial sum by performing an addition operation that adds the partial product to the final result, wherein the partial product and the addition operation are restricted to be performed within the required bits and a sign bit.

11. The method of claim 1, wherein the expression includes a modulo operation, the method further comprising:
replacing the expression with a modulo by an equivalent expression based on multiplication.

12. The method of claim 1, wherein the expression includes a division operator, the method comprising:
determining the number of required bits based on a number of bits of the result of logic simulation; and
increasing the number of required bits by a value based on a divisor of the division operator.

13. The method of claim 1, further comprising:
providing the circuit design for manufacturing of a circuit based on the circuit design.

14. A non-transitory storage medium storing instructions that when executed by a processor, cause the processor to perform steps comprising:
receiving a specification of a circuit design;
identifying an expression in the specification of the circuit design, the expression specifying an operation based on a variable, wherein the specification of the circuit design includes a declaration of the variable, wherein evaluation of the operation comprises determining one or more intermediate results;
identifying a set of required bits for the variable used in the expression, wherein a number of required bits in the set of required bits is determined based on a limit on the value of the variable, wherein the number of required bits is less than the number of bits specified in the declaration of the variable;
performing bit-level constraint solving using the expression by reducing the number of bits of each of the one or more intermediate results to the set of required bits;
determining a result of logic simulation based on the bit-level constraint solving; and
sending the result of logic simulation for display.

15. The non-transitory storage medium of claim 14, wherein the number of required bits is determined as a logarithm of the maximum of:
   (a) absolute value of the largest possible value of the variable, or
   (b) absolute value of the smallest possible value of the variable.

16. The non-transitory storage medium of claim 14, wherein the expression includes a shift operation comprising a left operand shifted by a value of a right operand, the instructions further causing the processor to perform steps comprising:
determining the required bits of the right operand as a set of least significant bits, where in the size of the set of least significant bits is determined based on a logarithm of the number of bits of the left operand.

17. The non-transitory storage medium of claim 16, the instructions further causing the processor to perform steps comprising:
determining saturation bits as a set of bits of the right operand that cause saturation of the left operand; and
determining the result of logic simulation based on the values of the saturation bits.

18. The non-transitory storage medium of claim 14, wherein the expression includes a multiply operation, the steps further comprising: determining the number of required bits based on the number of bits of the size of a result of logic simulation.

19. The non-transitory storage medium of claim 18, the instructions further causing the processor to perform steps comprising:
determining a final result by repeating a plurality of times:
   1) computing a partial product and
   2) determining a partial sum by performing an addition operation that adds the partial product to the final result, wherein the partial product and the addition operation restricted to be performed within the required bits and a sign bit.

20. A system comprising:
a processor; and
a non-transitory storage medium storing instructions that when executed by the processor, cause the processor to perform steps comprising:
receiving a specification of a circuit design, the specification using a hardware description language;
receiving a request to perform logic simulation of the circuit design;
identifying an expression in the specification of the circuit design, the expression specifying an operation based on a variable, wherein the specification of the circuit design includes a declaration of the variable, wherein evaluation of the operation comprises determining one or more intermediate results;

identifying a set of required bits for the variable used in the expression, wherein a number of required bits in the set of required bits is determined based on a limit on a value of the variable, wherein the number of required bits is less than the number of bits specified in the declaration of the variable;

performing bit-level constraint solving using the expression by reducing the number of bits of each of the one or more intermediate results to the set of required bits;

determining a result of logic simulation based on the bit-level constraint solving; and sending the result of logic simulation for display.

* * * * *